US010311177B1

(12) United States Patent
Tsuk et al.

(10) Patent No.: US 10,311,177 B1
(45) Date of Patent: Jun. 4, 2019

(54) ENHANCEMENTS TO PARAMETER FITTING AND PASSIVITY ENFORCEMENT

(71) Applicant: Ansys, Inc., Canonsburg, PA (US)

(72) Inventors: Michael J. Tsuk, Arlington, MA (US); Jacob K. White, Belmont, MA (US)

(73) Assignee: Ansys, Inc., Canonsburg, PA (US)

(*) Notice: Subject to any disclaimer, the term of this patent is extended or adjusted under 35 U.S.C. 154(b) by 43 days.

(21) Appl. No.: 15/267,554

(22) Filed: Sep. 16, 2016

Related U.S. Application Data

(62) Division of application No. 13/763,273, filed on Feb. 8, 2013, now Pat. No. 9,477,792.

(60) Provisional application No. 61/596,836, filed on Feb. 9, 2012.

(51) Int. Cl.
*G06F 17/50* (2006.01)

(52) U.S. Cl.
CPC ...... *G06F 17/5009* (2013.01); *G06F 17/5004* (2013.01)

(58) Field of Classification Search
CPC .......................... G06F 17/5009; G06F 17/5004
USPC .......................................................... 703/2
See application file for complete search history.

(56) References Cited

PUBLICATIONS

"Inverse Singular Value Method for Enforcing Passivity in Reduced-Order Models of Distributed Structures for Transient and Steady-State Simulation" Christopher S. Saunders et al.IEEE Transactions on Microwave Theory and Techniques, vol. 59, No. 4, Apr. 2011.*

* cited by examiner

*Primary Examiner* — Saif A Alhija
(74) *Attorney, Agent, or Firm* — Jones Day

(57) ABSTRACT

A model synthesizer generates a state-space model of a structure from frequency domain parameters of the structure using a selected number of significant eigenvalues of a matrix derived from the frequency-domain parameters such that the quality of the fit of the model is improved. A matrix of the frequency-domain parameters is reshaped so as to improve performance of determination of the fit quality. Passivity violations in the model can be removed via regularization and error control such that the fit quality of the model after removal of the passivity violations is within a specified tolerance. Cholesky factorization can improve the performance of passivity violation detection. This Abstract is provided for the sole purpose of complying with the Abstract requirement rules. This Abstract is submitted with the explicit understanding that it will not be used to interpret or to limit the scope or the meaning of the claims.

18 Claims, 4 Drawing Sheets

ENHANCEMENTS TO PARAMETER FITTING AND PASSIVITY ENFORCEMENT

CROSS-REFERENCE TO RELATED APPLICATIONS

This patent application is a divisional of U.S. application Ser. No. 13/763,273, filed Feb. 8, 2013, entitled "Enhancements to Parameter Fitting and Passivity Enforcement," and claims priority to and the benefit of U.S. Provisional Patent Application No. 61/596,836, which was filed on Feb. 9, 2012, the entirety of which are herein incorporated by reference.

FIELD OF THE INVENTION

The technology disclosed herein relates generally to determination of electrical properties of structures via simulation.

BACKGROUND

Measurement and simulation strategies for characterizing the response of a given structure to an input, e.g., the electrical behavior of interconnect and packaging structures for electronic circuits, electromagnetic behavior of antenna structures, etc., often utilize a frequency-domain approach. Physically, such an approach is equivalent to applying sinusoidal excitations to the terminals, or ports, of a structure and then measuring the response at the same and/or other ports. The relation between excitations and responses, and how those relations vary with sinusoidal frequency, are used to calculate scattering parameters. For a structure with p ports, measured at $n_f$ frequencies (where $n_f$ is typically hundreds or thousands), the scattering (or S-) parameter data is a set of $n_f$ matrices, where each matrix is a set of p×p complex numbers. The entry in the i-th row and j-th column of the matrix associated with a particular frequency f indicates how a sinusoidal excitation with frequency f applied to port j will affect the response at port i.

Simulators, which are typically used to compute the time evolution of voltages, currents, and/or electromagnetic fields in structures, often require accurate representations of the structure being simulated. For example, circuit simulators typically compute the voltages and/or currents representing the electrical behavior of interconnect and packaging used to couple various circuit blocks. For this reason, almost all commercial circuit simulators have some method for converting models of packaging and interconnect represented using frequency-domain S-parameter data into models that are suitable for time-domain simulation. A wide variety of methods are in common use, with convolution-based approaches being the most established.

The more modern and now preferred strategy for using S-parameter data in time domain circuit simulation is to construct a p-input, p-output system of linear differential equations whose response to sinusoid excitations closely matches the responses represented by the corresponding S-parameter data. Such a system of differential equations, usually referred to as a state-space model, may be easily included in time-domain circuit simulation.

In the case of a structure having a large number of ports, the number of transfer functions ($p^2$, where p denotes the number of ports) is usually much greater than the number of frequencies ($n_f$). This can affect compression, fast residue calculation, fast transfer function calculation during simulation of the structure. Grivet-Talocia describes a singular-value-decomposition-based method of generating a state-space model for structures having a large number of ports. See "A compression strategy for rational macromodeling of large interconnect structures," S. Grivet-Talocia, S. B. Olivadese, and P. Triverio, Proceedings of the 2011 IEEE 20th Conference on Electrical Performance of Electronic Packaging and Systems (EPEPS), pp. 53-56, 23-26 (October 2011), which is incorporated herein by reference, in its entirety.

The basic idea of this paper is that large port-count S-parameters have substantial redundant information, which the singular value decomposition (SVD) can uncover. A large matrix X is created by stacking the $p^2$ entries of the S-parameter matrix next to each other. Then the singular value decomposition on X is performed, generating matrices U, S, and V. The product of the significant singular values, i.e., entries 1:k of the diagonal of S, with the appropriate columns of U, give the so-called "basis functions" that can represent the important information in the original data. The corresponding columns of V indicate how to combine the basis functions to recreate the original S-parameter data. One problem with Grivet-Talocia's method is that, if the port count p is high, the X matrix is extremely wide, which makes the V matrix extremely tall and significantly slows down the SVD.

SUMMARY

In various embodiments, systems and methods for analysis and simulation of electrical properties of a physical structure are improved by observing that it is not actually needed to know what the appropriate basis functions are. Therefore, the computation of the singular value decomposition of the X matrix can be avoided. Instead, it may be sufficient to know approximately how many basis functions there are, by checking the quality of the fit of a state-space model obtained from the selected basis functions, which are subset of the original S-parameter matrix, with respect to the entire S-parameter matrix. This can significantly decrease the time taken to generate a model and may facilitate quick simulations of physical systems.

Moreover, in various embodiments the passivity of the model can be enforced, while simultaneously checking the quality of the fit. The quality of the fit generally refers to a measure of whether the model fitting error (i.e., the difference between the input S-parameters and the S-parameters of the model) is above or below a certain user-specified level. If the fit quality deteriorates beyond a specified threshold due to the adjustments necessitated by the passivity violations, the fit quality is improved using additional S-parameter values. Detection of passivity violations can be significantly improved using Cholesky factorization. Thus, various embodiments facilitate efficient generation of a state-space model that does not contain passivity violations, and has a fit quality within a desirable, specified threshold.

Accordingly, in one aspect, embodiments of the invention feature a computer-implemented method for generating by a processor a passive model of a structure. In another aspect, embodiments of the invention feature an apparatus including a processor and a memory including processor executable instructions that, when executed by the processor, configure the apparatus to generate the passive model. In yet another aspect, embodiments of the invention feature an article of manufacture including a non-transitory machine-readable medium storing instructions that, when executed by a machine, configure the machine to generate the passive model. The method includes receiving, and instructions in the apparatus and/or the article are provided to receive, in memory, parameter data corresponding to the structure. The parameter data is represented as a first rectangular matrix having M rows and N columns, M being different than N.

The method includes generating, and the instructions are provided to generate, a second square matrix based on the first matrix. The square matrix has L rows and columns such that L is equal to the least of M and N. The method and/or instructions are also provided to generate eigenvalues of the square matrix and to determine a number K of significant eigenvalues. K values from the first matrix are selected according to the method and/or instructions, and the method and/or instructions also provide for generating a model matrix H using the K selected values, such that the model matrix H can model the structure.

In some embodiments, the method and/or instructions further provide for determining a fit between the model matrix H and the first matrix. If the quality of the fit is less than a threshold value, the method include and the instructions are provided for (i) selecting one or more additional values from the first matrix, and (ii) generating an updated model matrix H by repeating the generating step using the K previously selected values and the one or more additional selected values.

The determination of the fit quality may include performing a least-square approximation and reshaping the first rectangular matrix into a one-column matrix. The parameter data may include S-parameter data, Y-parameter data, or Z-parameter data. In some embodiments, each of the M rows corresponds to one of several frequencies and each of the N columns corresponds to one of a number of pair-wise combinations of ports of the structure. The structure may include electrical circuitry, an electromagnetic component, or both.

In another aspect, various embodiments feature a computer-implemented method for enforcing passivity of a model matrix H. In another aspect, an apparatus including a processor and a memory including processor executable instructions that, when executed by the processor, configure the apparatus to enforce passivity of a model matrix H. In yet another aspect, embodiments of the invention feature an article of manufacture including a non-transitory machine-readable medium storing instructions that, when executed by a machine, configure the machine to enforce passivity of a model matrix H. The matrix H, which represents a model of a structure, includes a system matrix A, a control matrix B, an output matrix C, and a feed-forward matrix D.

The method provides for determining, and/or instructions stored in the memory and/or storage medium configure the processor to determine, if a passivity violation exists in the model matrix H for a frequency. If passivity violation is determined to exist, the method provides for updating and the instructions configure the processor to update a Σ matrix corresponding to the model matrix H. The Σ matrix together with U and V matrices represents the singular value decomposition of the model matrix H. Additionally, the method includes updating, and the instructions configure the processor to update, the model matrix H based on the updated Σ matrix. The updating step includes controlling error.

Controlling the error may include identifying a region of no passivity violation; and improving the fit quality by reducing fitting error between the updated model matrix H and parameter data associated with the structure. In some embodiments, the updating step includes reshaping a matrix derived from the updated Σ matrix and the U and V matrices, and computing a least square approximation based on the reshaped derived matrix. The determination of passivity violation may include performing Cholesky factorization.

In another aspect, various embodiments feature a system for generating a passive model of a structure. The system includes a transform module to receive, in memory, parameter data corresponding to the structure. The parameter data are represented as a first rectangular matrix having M rows and N columns, M being different than N. The transform module also generates a second square matrix based on the first matrix. The square matrix has L rows and columns such that L is equal to the least of M and N. The system includes an analyzer module to generate eigenvalues of the square matrix, and to determine a number K of significant eigenvalues. In addition, the system includes a model generator to select K values from the first matrix, and to generate a model matrix H using the K selected values, such that the model matrix H can model the structure.

In some embodiments, the model generator is adapted to compute a fit quality of the model matrix H. If the fit quality is less than a threshold, the model generator may select one or more additional values from the first matrix and update the matrix H based on the additional value. The computation of the fit quality may include least-square approximation and reshaping the first rectangular matrix into a one-column matrix. The parameter data may include one or more of S-parameter data, Y-parameter data, and Z-parameter data.

In some embodiments, each of the M rows corresponds to one of several frequencies and each of the N columns corresponds to one of a number of pair-wise combinations of ports of the structure. The structure may include electrical circuitry, an electromagnetic component, or both. In some embodiments, the system includes a processor, and the memory contains, in part, instructions to configure the processor as one or more of the transform module, the analyzer module, and the model generator.

In yet another aspect, various embodiments feature a system for enforcing passivity of a model matrix H. The matrix H, which represents a model of a structure, includes a system matrix A, a control matrix B, an output matrix C, and a feed-forward matrix D. The system includes a passivity-checking module to determine if a passivity violation exists in the model matrix H for a frequency. The system also includes a passivity-enforcement module to update a Σ matrix corresponding to the model matrix H, if passivity violation is determined to exist by the passivity-checking module. The Σ matrix together with U and V matrices represents the singular value decomposition of the model matrix H. The system also includes a model generator to update the model matrix H based on the updated Σ matrix, and to control error associated with the updated model matrix H.

In some embodiments, to control error, the model generator is adapted to identify a region of no passivity violation, and to improve quality of the fit by reducing a fitting error between the updated model matrix H and parameter data associated with the structure. To update the model matrix H, the model generator may be adapted to reshape a matrix derived from the updated Σ matrix and the U and V matrices. The model generator may further compute a least square approximation based on the reshaped derived matrix. The passivity-checking module may be adapted to perform Cholesky factorization. In some embodiments, the system includes a processor, and the memory contains, in part, instructions to configure the processor one or more of the passivity-checking module, the passivity-enforcement module, and the model generator.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Model Synthesis System

Figure 1A:
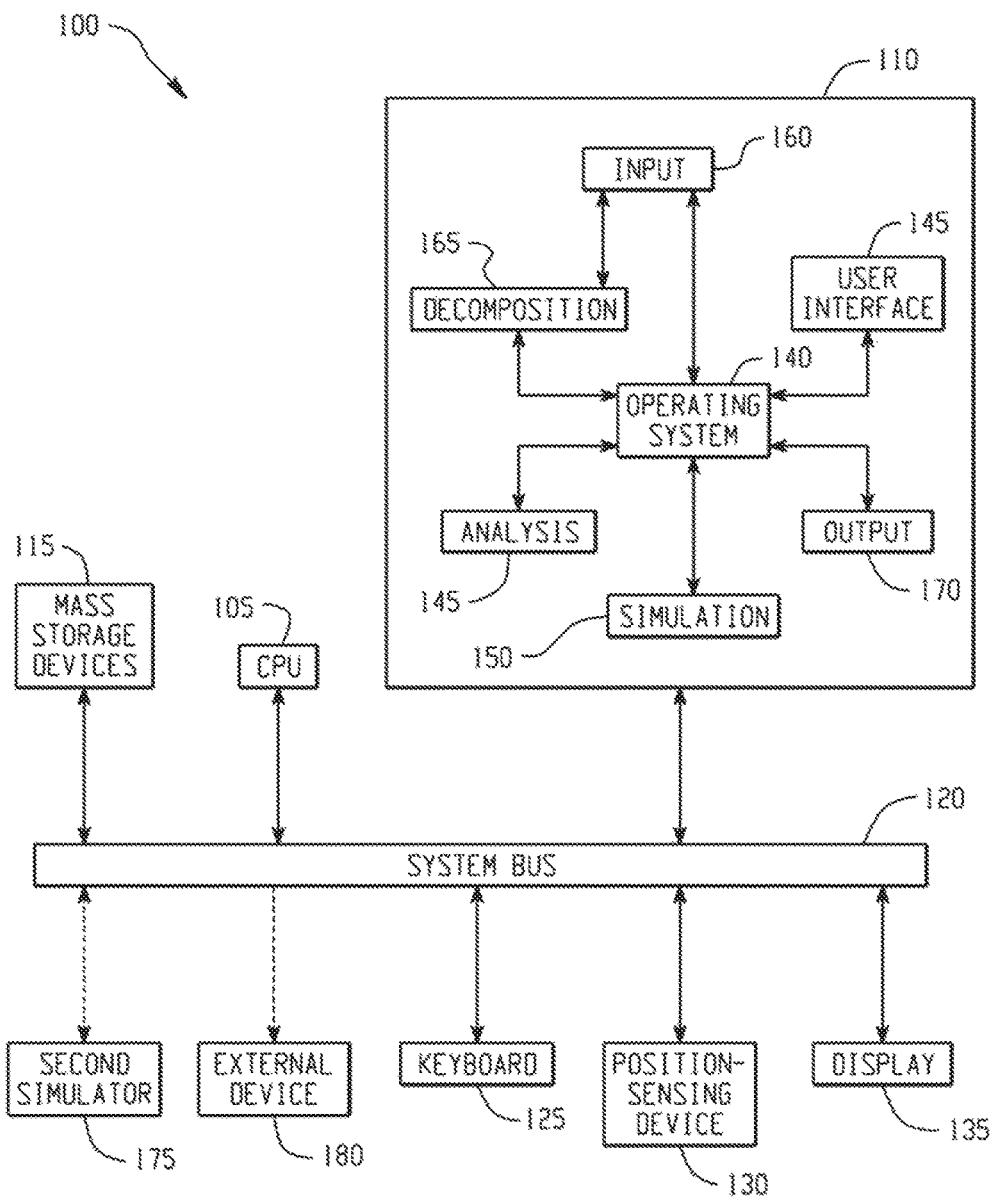
FIG. 1A is a schematic block diagram of an exemplary model synthesizer in accordance with various embodiments of the invention.

Referring to FIG. 1A, in various embodiments of the invention, a model synthesizer 100 includes a central-processing unit (CPU) 105, a main memory 110, and one or more mass storage devices 115 all connected to a system bus 120, over which all of the components of the system communicate. CPU 105 directs the operation of model synthesizer 100, and each mass storage device 115 stores, e.g., input data and/or output data for retrieval and/or further processing. A user may interact with model synthesizer 100 using a keyboard 125 and/or a position-sensing device (e.g., a mouse or trackball) 130. The output of either device may be used to designate information or select particular areas of a display 135 to direct functions to be performed by model synthesizer 100.

The main memory 110 contains a group of modules that control the operation of CPU 105 and its interaction with other hardware components. An operating system 140 directs the execution of low-level, basic system functions such as memory allocation, file management, and operation of mass storage devices 115. At a higher level, an analysis module 145 and an optional simulation module 150 direct execution of the primary functions performed by embodiments of the invention, as discussed below, and a user interface module 155 enables straightforward interaction with model synthesizer 100 over display 135. For example, the analysis module 145 may perform one or more of the operations described with reference to FIGS. 2 and 3.

Figure 1B:
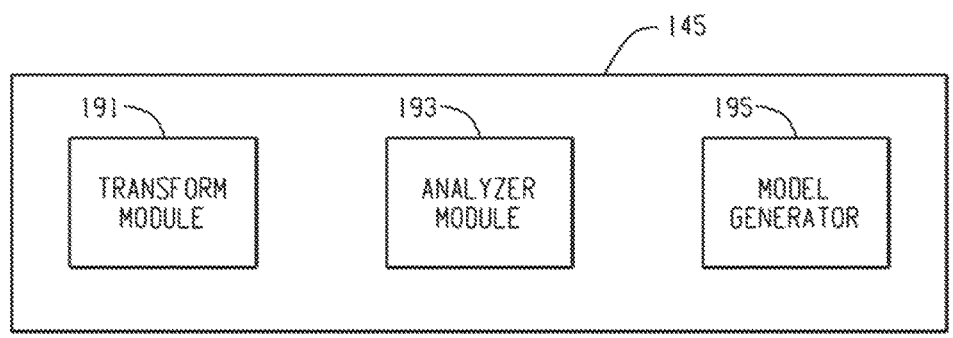
FIGS. 1B and 1C schematically depict various components of an analysis module included in the model synthesizer depicted in FIG. 1A.

Referring to FIG. 1B, in one exemplary embodiment the analysis module 145 includes a transform module 191 to perform various matrix operations on the received frequency-domain data, an analyzer module 193 to extract the information to be used for model generation, from a matrix generated by the transform module 191, and a model generator 195 to generate a state-space model based on the received data and the extracted information. The analyzer module 193 may also compute a quality of the fit of the generated module.

Figure 1C:
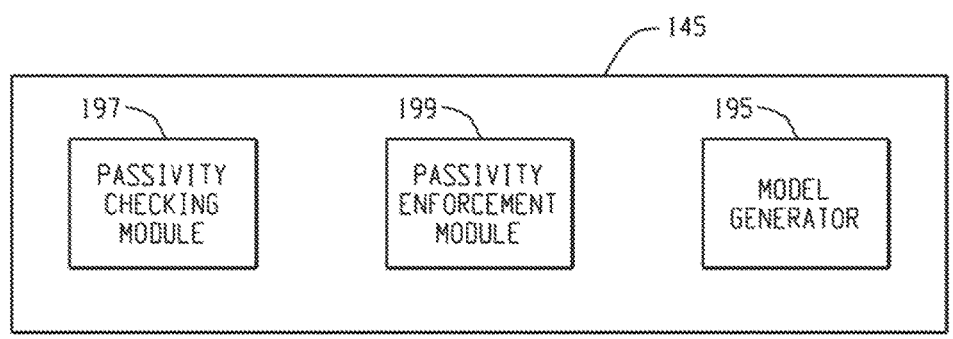

Referring to FIG. 1C, in another exemplary embodiment, the analysis module 145 includes a passivity-checking module 197 and a passivity enforcement module 199 to ensure that the model generated by the model generator 195 is passive. The model generator 195 is further adapted to adjust the model based on the information provided by the passivity enforcement module 199, and to control the fit quality by reducing the fitting error associated with the updated model. It should be understood that various embodiments may include all or various combinations of the modules illustrated with reference to FIGS. 1B and 1C. The CPU 105 may be configured to provide the analysis module 145, including one or more of the transform module 191, analyzer module 193, model generator 195, passivity-checking module 197, and the passivity enforcement module 199.

Referring again to FIG. 1A, an input module 160 accepts input data corresponding to a system or network to be simulated from, e.g., a mass storage device 115, keyboard 125, and/or position-sensing device 130, or in some implementations, from an external signal source. The input data may include or consist essentially of digitized information corresponding to the system to be simulated, e.g., an electrical circuit (and/or the interconnect network and/or packaging thereof) or any of a variety of other physical (e.g., mechanical) systems (such as the turbulent flow of a fluid through a pipe when the input and output flows are not turbulent). As used herein, the term "physical system" refers to physical structures, objects, or substances that exhibit time-evolving behavior. For example, the input data may be digital values representing signal levels at terminals of an electronic circuit. Generally, the input data will be a representation of the system in the frequency domain. A decomposition module 165 converts such input data into a set of S-parameters for further processing (as described below) using techniques well-established in the art (see, for example, B. Young, *Digital Signal Integrity: Modeling and Simulation with Interconnects and Packages*, Prentice Hall (2000).). Alternatively, input module 160 may directly accept as input data the set of S-parameters, obviating the need for processing by decomposition module 165.

An output module 170 directs output data from analysis module 145 and/or simulation module 150 to, e.g., a mass storage device 115 for storage, display 135 for presentation, a second optional simulator 175 for further analysis and/or simulation, and/or an external device 180 to operate as an input thereto (e.g., as a control signal to an electronic device).

Although the modules in main memory 110 have been described separately, this is for clarity of presentation only. As long as model synthesizer 100 performs all necessary functions, it is immaterial how they are distributed therewithin and the programming or hardware architecture thereof. Furthermore, the above-described implementation is exemplary only. Other hardware approaches are possible, e.g., the various modules of embodiments of the invention may be implemented on a general-purpose computer programmed with appropriate software instructions implementing the functions described below, or as hardware circuits (e.g., as an application-specific integrated circuit, or ASIC), or as mixed hardware-software combinations.

Fitting Enhancements

In various embodiments, the singular values of X can be extracted from the eigenvalues of $XX^H$, which, given the fact that X is short and wide, is a significantly smaller matrix, and $XX^H$ is Hermitian, which also improves the efficiency. If needed, U can be extracted from this formulation, but not V, where $X=U\Sigma V$ represents the singular value decomposition of X. But matrix V is not required to generate a state-space model according to the various embodiments.

In general, for a matrix of rank k, only 2k columns chosen at random can be sufficient to generate the same rank. This concept for the basis for an iterative process according to various embodiments. Eigenvalues of $XX^H$, are obtained and k is determined to be the number of significant eigenvalues, e.g., the largest values that are real numbers. One method of selecting k is to sort the eigenvalues in decreasing order, and then choose k of them such that the ratio of the smallest to the largest within those selected is equal to a selected fitting tolerance (e.g., within 1%, 0.5%, etc.). The largest 3k/2 frequency dependent entries from the S-parameter data are then selected, and stacked as one large column from which a state-space fit can be generated. Typically, the S-parameter matrix entries having the largest absolute values are selected. If the values are similar those with the most frequency variation may be selected. The poles of this fit are then used to generate residues for the entire S-parameter matrix, and those that do not fit within the specified tolerance are added to the list of candidates to be included in the column. This step is iterated until all entries of the S-parameter matrix are fit as well as those selected for pole extraction. Because all of the transfer functions to be fit are combined into one large column, a set of common poles for the entire S-parameter matrix can be obtained in various embodiments.

This has several advantages, most notably that it preserves symmetry of the fit if the data is itself symmetric, but it also poses some challenges. For example, to convert these poles to a state-space system requires creating an A matrix that hasp copies of the identical submatrix (the block two-by-two diagonal matrix corresponding to the calculated poles), which is a significant inefficiency as the number of ports, p, becomes large.

One solution for this, which turns out to be useful in many other areas of the fitting and passivity enforcement algorithms, is to reshape the system. Instead of performing fitting with the original system, with its p inputs and p outputs, the S-parameter matrix is considered as if it represented a system with one input and $p^2$ outputs. As such, if there are $n_s$ common poles, the A matrix may have the dimensions $n_s \times n_s$ with only a single copy of the poles; the B matrix will be $n_s \times 1$; the C matrix will be large, $p^2 \times n_s$; and the D matrix, $p^2 \times 1$. The calculation of residues, given the poles (or in state-space terms, the calculation of C and D, given A and B) turns out to be an unusual least-squares problem, with a number of right-hand-sides equal to the rows of C, i.e., $p^2$. This requires bypassing the standard least-square solvers (e.g., Intel MKL least-squares driver functions) for maximal computational efficiency. This reordering of the S-parameter matrix also enables fast calculation of the fitted transfer function matrix, taking advantage of the ability of conventional linear-algebra solvers (e.g., Intel's MKL) to do fast, memory-local multiplications of large matrices.

The process is as follows. Using the state-space matrices as discussed above, and a list of frequencies f of length $n_f$ a matrix X, size $n_s \times n_f$ is formed where each column i of X is the result of $(2\pi j f_i I - A)^{-1} B$. Then the matrix Y of size $p^2 \times n_f$ is formed with a single matrix-matrix multiplication, $C \times X$, and adding in replications of the columns of D resulting in the final fitted transfer function.

Figure 2:
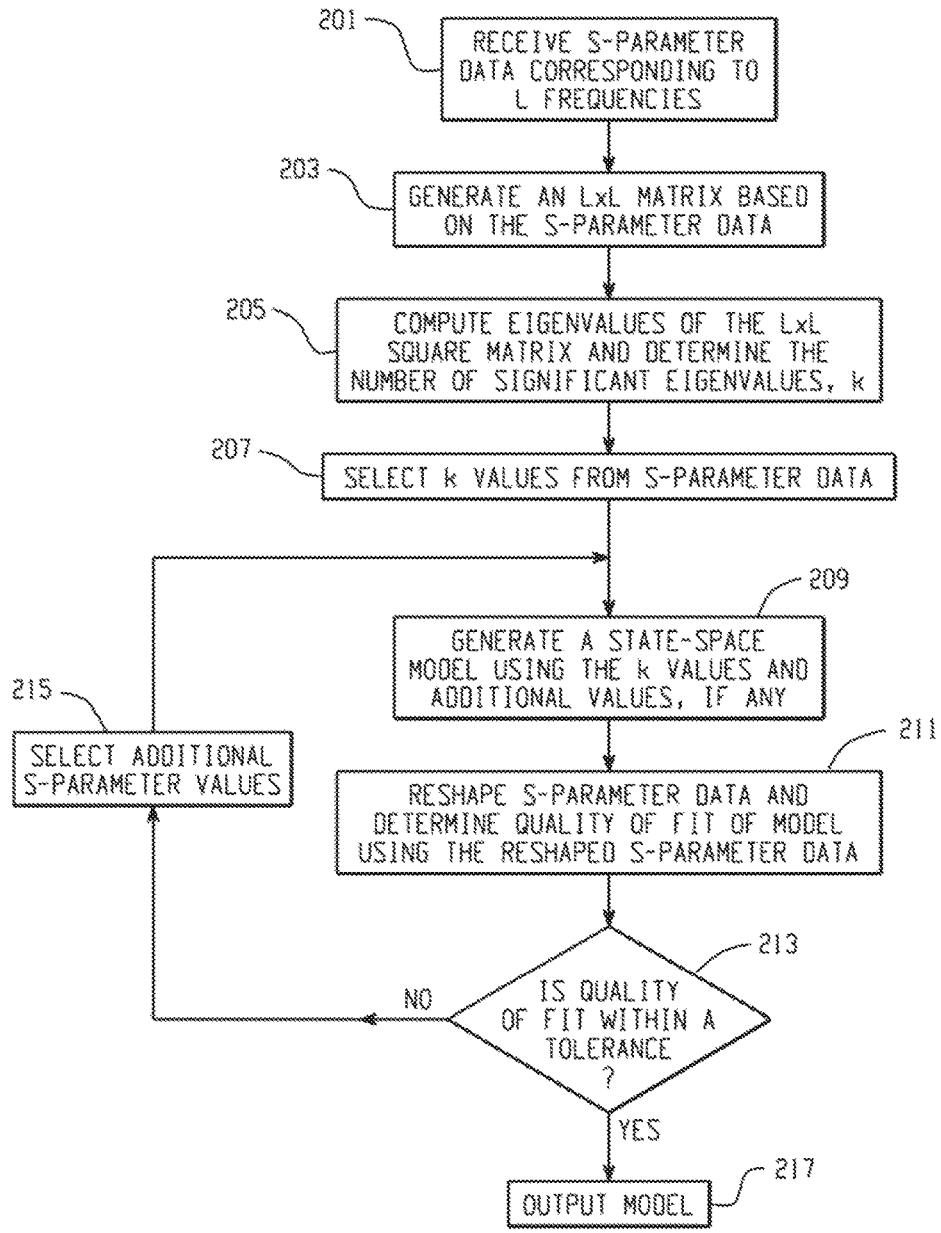
FIG. 2 is a flowchart of an exemplary method of efficiently generating a state-space model, in accordance with various embodiments of the invention.

In one embodiment illustrated with reference to FIG. 2, S-parameter data corresponding to L (also called $n_f$) frequencies is received in step 201. An L×L matrix is generated based on the S-parameter data in step 203. Eigenvalues of the L×L square matrix are computed in step 205. The number k of significant (e.g., the largest) eigenvalues is also determined in step 205. Then, in step 207, k values from the S-parameter data are selected in step 207. For example the largest k values may be selected from the S-parameter data.

In step 209, a state-space model is generated using the selected k values from the S-parameter data, and any additional values that may have been selected in a previous iteration. Reshape the S-parameter data in step 211 and compute a quality of the fit of the model generated in step 209 using the reshaped S-parameter data. In step 213, it is determined whether the model's fit quality is within a specified tolerance. If not, in step 215 additional S-parameter values are selected and the steps 209-213 are repeated. Once the fit quality is determined to be within a tolerance in step 213, the model is provided for use in step 217, e.g., simulating a system being modeled by the model.

Passivity Enhancements

In some situations, often with data that exhibit significant non-causality, there is a problem with the above described state-space fitting: a tendency for large out-of-band passivity violations. These are typically due to over fitting, to the tendency for the least-squares solution to contain large values for the residues, which delicately cancel in band to slightly reduce the fitting error, at the cost of creating large out-of-band passivity violations, since there are no constraints on these.

In various embodiments, the passivity violations may be removed as follows. First, taking advantage of systems/methods to generate fits for different orders rapidly, the fitting process starts with a selection of high-order fits. One example of such systems/methods for rapidly generating fits using eigenvalues is described above. Another example is described in U.S. patent application Ser. No. 12/577,844 titled State-Space Model-Based Simulators and Simulators, by Michael J. Tsuk and Jacob K. White, filed on Oct. 13, 2009, which is incorporated herein by reference in its entirety. If these fits are unable to meet the target tolerance, the process backs off, so as to avoid over fitting. Also, a "regularization" step has been added to the process of calculating residues, additional constraints that push down the absolute value of the residues, at some cost to the fit quality. This combination gives more passive state-space fits, which reduces the computational load on passivity enforcement downstream.

The passivity enforcement method called "passivity enforcement by iterated fitting of passivity violations," (IFPV), extends methods described in: "Efficient Algorithm for Passivity Enforcement of S-Parameter-Based Macromodels," Dhaene, Deschrijver, and Stevens, MTT February 2009 ("Dhaene"), which is incorporated by reference in its entirety. According to Dhaene's method, a dense grid of frequency points may be created, going above the band of the original data, but not necessarily including the original frequency points. The method continues, trying to fit (with the original A and B matrices) the violations of passivity on the dense grid, iteratively knocking them down. But there is no control on the quality of the fit.

Two improvements to the method described in Dhaene are provided. First, error control has been added, so that the state-space fits to passivity violations tend both to minimize those violations and the fitting error, thereby improving the fit quality. Various embodiments add in the original set of frequency points, and at each iteration, the quality of the fit between the modified state-space system and the original data is evaluated. It is desirable to reduce/eliminate the passivity violations without increasing the fitting error. In general, however, this may not be feasible. Therefore, there is a conflict at each stage of the iteration: decreasing the passivity violations versus preserving the quality of the fit.

This conflict is arbitrated with the weighted least squares. If the error is above a certain threshold, the least squares fitting is weighted to emphasize the error over passivity improvements; if the passivity violations are large, the least squares are weighted in the opposite manner.

Figure 3:
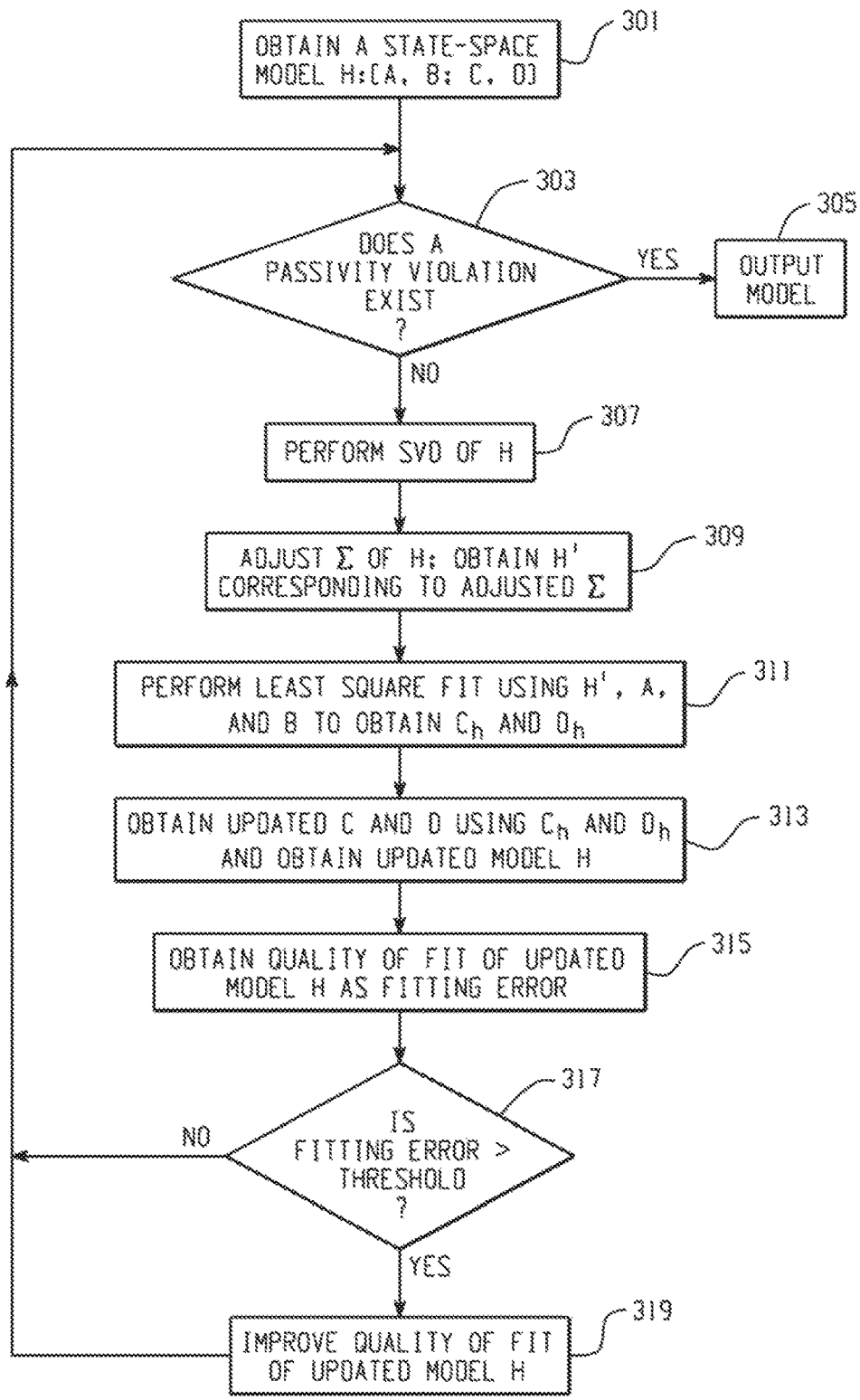
FIG. 3 is a flowchart of an exemplary method of efficiently eliminating or at least reducing passivity violations in a model of a structure, in accordance with various embodiments of the invention.

With reference to FIG. 3, in step 301 the state-space model is described as $H(s)=C_t(sE-A)^{-1} B+D_t$ where t is the index of an iteration. A check for a passivity violation is performed in step 303, and if no passivity violation exists, the model is provided, e.g., for simulation thereof, in step 305. If a passivity violation exists, however, in step 307 the singular value decomposition (SVD) of the H matrix is performed to obtain $\Sigma$ as $H=U\Sigma V$.

In a regularization step 309, $\Sigma'$ is obtained by adjusting the passivity violations in the diagonal matrix $\Sigma$. For example, from the values in $\Sigma$ that are greater than one, thereby indicating a passivity violation, a constant value $\delta$ slightly less than one (e.g., 0.9, 0.999, etc.) is subtracted to obtain $\Sigma'$. $\Sigma'$ corresponds to H', given by $H'=U\Sigma'V$. This function will be generally zero, except where original data contained passivity violations.

In step 311, based on A and B from the original fit, linear least squares approximation, such as that described earlier, is used to determine $C_h$ and $D_h$. Specifically, the Equation $H'(s)=C_h (sE-A)^{-1}B+D_h$ can be solved using the least-squares method for $C_h$ and $D_h$. Thereafter in step 313, the C and D matrices are updated as $C_{t+1}=C_t-C_h$ and $D_{t+1}=D_t-D_h$ t+1 corresponding to the next iteration. A new or updated model $H_{t+1}$ is computed using A and B from the original fit and $C_{t+1}$ and $D_{t+1}$.

In step 315, the quality of the fit of the updated model $H_{t+1}$ is computed with respect to the frequency domain data (e.g., S parameters) from which the initial matrix H was obtained. The least square method, as described earlier, can be used to compute the quality of the fit, but other methods may also be employed. It is determined in step 315 whether the fitting error is greater than a certain preset threshold, or alternatively, whether the difference between the fitting error of $H_{t+1}$ and that of H is greater than a preset threshold. If the fitting error is greater than the threshold, in step 319 the model $H_{t+1}$ is further updated to reduce the fitting error, i.e., to improve the fit quality. This improvement can be performed according to the embodiments described in the "Fitting Enhancements" Section. After improving the quality of the fit in step 319 or if the fitting error is determined to be less than the threshold in step 317, the steps 303-315 are repeated for a selected number of iterations or until no passivity violations are detected in the model in step 303.

A second improvement can increase the speed of computations. In particular, various embodiments increase the speed of IFPV by including reshaping of matrix, as described earlier. Furthermore, it was recognized that a significant portion of the method's work is typically in step 303, testing whether particular points of the fitted transfer function (e.g. values corresponding to a certain frequency) are passive or not. Using the Cholesky decomposition to test passivity, in some embodiments, facilitates faster (e.g., up to five times faster in some situations) enforcement of passivity than other methods including the SVD.

Results

Table 1 shows the results for a variety of test cases, comparing the old and new methods with respect to both speed and accuracy.

TABLE 1

| File | Old time (sec) | Old error | New time (sec) | New error | Speed up | Improvement |
|---|---|---|---|---|---|---|
| hfss.out.dan2.s2p | 61.93 | 0.95% | 15.95 | 0.89% | 3.88 | 1.07 |
| FourPort_HFSS_V12.s4p | 142.73 | 634076% | 2.64 | 10.28% | 53.97 | 61,658.35 |
| x6..traces.s6p | 893.01 | 19.98% | 69.50 | 5.20% | 12.85 | 3.85 |
| comp.s8p | 125.55 | 16.59% | 10.83 | 0.75% | 11.60 | 21.99 |
| x1by1..patch.s10p | 0.24 | 0.99% | 1.33 | 1.17% | 4.69 | 0.85 |
| agp.s12p | 82.58 | 3.99% | 16.85 | 1.60% | 4.90 | 2.50 |
| Package.s19p | 38.78 | 1.26% | 56.70 | 0.76% | 0.68 | 1.66 |
| LNA_900MHz.s30p | 839.54 | 18.48% | 23.30 | 8.93% | 36.03 | 2.07 |

Systems according to the above-described embodiments may be able to handle large model-fitting and passivity enforcement problems within the time and memory constraints of typical workstation PCs. These systems are configured to be able to generate high-quality, passive state-space fits generally not attainable using other systems. For example, a passive state-space fit to 200+ port S-parameter data may be obtained in typically half an hour, and to 400+ port S-parameter data in around four hours using various embodiments.

One skilled in the art will appreciate that the present invention can be practiced by other than the above-described embodiments, which are presented in this description for purposes of illustration and not of limitation. The specification and drawings are not intended to limit the exclusionary scope of this patent document. It is noted that various equivalents for the particular embodiments discussed in this description may practice the invention as well. That is, while the present invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the following claims. The fact that a product, process, or method exhibits differences from one or more of the above-described exemplary embodiments does not mean that the product or process is outside the scope (literal scope and/or other legally-recognized scope) of the following claims.

The invention claimed is:

1. A computer-implemented method of enforcing passivity of a model of a physical structure, the model of the physical structure comprising a state-space model a system model, and a control model, the method comprising:

receiving in memory, by a processor coupled to the memory, the state space model having a passivity violation;

generating, by the processor, a singular value decomposition model of the state space model, the singular value decomposition model comprising a diagonal matrix of values, wherein at least one values exceed a passivity violation threshold thereby indicating the passivity violation;
generating, by the processor, a modified diagonal matrix from the diagonal matrix replacing the at least one values with a value that does not exceed the passivity violation threshold;
generating, by the processor, a modified singular value decomposition model from the singular value decomposition model by replacing the diagonal matrix of the singular value decomposition model with the modified diagonal matrix; and
generating, by the processor, a modified state space model based on the modified singular value decomposition model;
generating, by the processor, an output matrix iteration and a feed forward matrix iteration by computing a linear least squares approximation of the modified state space model based on the system model and the control model;
generating, by the processor, a new iteration of the state space model based on the output matrix, the feed forward matrix, the system model, and the control model;
determining a quality of fit error between the new iteration of the state space model and the state space model; and
when the quality of fit error satisfies a threshold, updating the state space model in memory to obtain an updated state space model, by the processor, by replacing the state space model with the new iteration of the state space model; and
simulating electrical properties of the physical structure using the updated state space model, wherein the physical structure is built or modified based on the simulated electrical properties.

2. The method of claim 1, further comprising:
when the quality of fit error does not satisfy the threshold:
generating, by the processor, a new singular value decomposition model of the new iteration of the state space model, the new singular value decomposition model comprising a second diagonal matrix of second values, wherein at least one second values exceed the passivity violation threshold thereby indicating the passivity violation;
generating, by the processor, a second modified diagonal matrix from the second diagonal matrix replacing the at least one second values with a second value that does not exceed the passivity violation threshold;
generating, by the processor, a second modified singular value decomposition model from the new singular value decomposition model by replacing the second diagonal matrix of the new singular value decomposition model with the second modified diagonal matrix; and
generating, by the processor, a second modified state space model based on the second modified singular value decomposition model;
generating, by the processor, a second output matrix iteration and a second feed forward matrix iteration by computing a second linear least squares approximation of the second modified state space model based on the system model and the control model;
generating, by the processor, a second new iteration of the state space model based on the output matrix, the feed forward matrix, the system model, and the control model; and
determining a second quality of fit error between the second new iteration of the state space model and the state space model; and
when the second quality of fit error satisfies the threshold, updating the state space model in memory to obtain an updated state space model, by the processor, by replacing the state space model with the second new iteration of the state space model.

3. The method of claim 1, wherein the updating step comprises: generating a derived model based on the new diagonal matrix and the singular value decomposition model; and computing a least squares approximation based on the derived model, wherein generating the derived model includes reshaping a matrix.

4. The method of claim 1, wherein the passivity violation is identified using Cholesky factorization.

5. The method of claim 1, wherein the physical structure is a packaging structure for an electronic circuit.

6. The method of claim 1, wherein the physical structure is an antenna structure.

7. A system for enforcing passivity of a model of a physical structure, the model of the physical structure comprising a state-space model a system model, and a control model, the system comprising:
one or more processors; and
non-transitory computer readable media having computer executable instructions stored therein, which when executed by at least one processor cause the system to perform operations comprising:
receiving in memory the state space model having a passivity violation;
generating a singular value decomposition model of the state space model, the singular value decomposition model comprising a diagonal matrix of values, wherein at least one values exceed a passivity violation threshold thereby indicating the passivity violation;
generating a modified diagonal matrix from the diagonal matrix replacing the at least one values with a value that does not exceed the passivity violation threshold;
generating a modified singular value decomposition model from the singular value decomposition model by replacing the diagonal matrix of the singular value decomposition model with the modified diagonal matrix; and
generating a modified state space model based on the modified singular value decomposition model;
generating an output matrix iteration and a feed forward matrix iteration by computing a linear least squares approximation of the modified state space model based on the system model and the control model;
generating a new iteration of the state space model based on the output matrix, the feed forward matrix, the system model, and the control model;
determining a quality of fit error between the new iteration of the state space model and the state space model; and
when the quality of fit error satisfies a threshold, updating the state space model in memory to include the new iteration of the state space model;

simulating properties of the physical structure using the updated state space model, wherein the physical structure is built or modified based on the simulated properties.

8. The system of claim 7, wherein, when the quality of fit error does not satisfy the threshold, the instructions further cause the system to perform operations comprising:
generating a new singular value decomposition model of the new iteration of the state space model, the new singular value decomposition model comprising a second diagonal matrix of second values, wherein at least one second values exceed the passivity violation threshold thereby indicating the passivity violation;
generating a second modified diagonal matrix from the second diagonal matrix replacing the at least one second values with a second value that does not exceed the passivity violation threshold;
generating a second modified singular value decomposition model from the new singular value decomposition model by replacing the second diagonal matrix of the new singular value decomposition model with the second modified diagonal matrix; and
generating a second modified state space model based on the second modified singular value decomposition model;
generating a second output matrix iteration and a second feed forward matrix iteration by computing a second linear least squares approximation of the second modified state space model based on the system model and the control model;
generating a second new iteration of the state space model based on the output matrix, the feed forward matrix, the system model, and the control model; and
determining a second quality of fit error between the second new iteration of the state space model and the state space model; and
when the second quality of fit error satisfies the threshold, updating the state space model in memory to obtain an updated state space model by replacing the state space model with the second new iteration of the state space model.

9. The system of claim 7, wherein the instructions further cause the system to perform operations comprising:
generating a derived model based on the new diagonal matrix and the singular value decomposition model; and computing a least squares approximation based on the derived model, wherein generating the derived model includes reshaping a matrix.

10. The system of claim 7, wherein the passivity violation is detected using Cholesky factorization.

11. The system of claim 7, wherein the physical structure is a packaging structure for an electronic circuit.

12. The system of claim 7, wherein the physical structure is an antenna structure.

13. A non-transitory computer-readable medium encoded with instructions for commanding one or more data processors to execute steps of a method for enforcing passivity of a model of a physical structure, the model of the physical structure comprising a state-space model a system model, and a control model, the method comprising:
receiving in memory, by a processor coupled to the memory, the state space model having a passivity violation;
generating, by the processor, a singular value decomposition model of the state space model, the singular value decomposition model comprising a diagonal matrix of values, wherein at least one values exceed a passivity violation threshold thereby indicating the passivity violation;
generating, by the processor, a modified diagonal matrix from the diagonal matrix replacing the at least one values with a value that does not exceed the passivity violation threshold;
generating, by the processor, a modified singular value decomposition model from the singular value decomposition model by replacing the diagonal matrix of the singular value decomposition model with the modified diagonal matrix; and
generating, by the processor, a modified state space model based on the modified singular value decomposition model;
generating, by the processor, an output matrix iteration and a feed forward matrix iteration by computing a linear least squares approximation of the modified state space model based on the system model and the control model;
generating, by the processor, a new iteration of the state space model based on the output matrix, the feed forward matrix, the system model, and the control model;
determining a quality of fit error between the new iteration of the state space model and the state space model; and
when the quality of fit error satisfies a threshold, updating the state space model in memory to obtain an updated state space model, by the processor, by replacing the state space model with the new iteration of the state space model; and
simulating electrical properties of the physical structure using the updated state space model, wherein the physical structure is built or modified based on the simulated electrical properties.

14. The memory of claim 13, wherein the method further comprises:
when the quality of fit error does not satisfy the threshold:
generating, by the processor, a new singular value decomposition model of the new iteration of the state space model, the new singular value decomposition model comprising a second diagonal matrix of second values, wherein at least one second values exceed the passivity violation threshold thereby indicating the passivity violation;
generating, by the processor, a second modified diagonal matrix from the second diagonal matrix replacing the at least one second values with a second value that does not exceed the passivity violation threshold;
generating, by the processor, a second modified singular value decomposition model from the new singular value decomposition model by replacing the second diagonal matrix of the new singular value decomposition model with the second modified diagonal matrix; and
generating, by the processor, a second modified state space model based on the second modified singular value decomposition model;
generating, by the processor, a second output matrix iteration and a second feed forward matrix iteration by computing a second linear least squares approximation of the second modified state space model based on the system model and the control model;

generating, by the processor, a second new iteration of the state space model based on the output matrix, the feed forward matrix, the system model, and the control model; and determining a second quality of fit error between the second new iteration of the state space model and the state space model; and when the second quality of fit error satisfies the threshold, updating the state space model in memory to obtain an updated state space model, by the processor, by replacing the state space model with the second new iteration of the state space model.

15. The memory of claim 13, generating a derived model based on the new diagonal matrix and the singular value decomposition model; and computing a least squares approximation based on the derived model, wherein generating the derived model includes reshaping a matrix.

16. The memory of claim 13, wherein the passivity violation is identified using Cholesky factorization.

17. The memory of claim 13, wherein the physical structure is a packaging structure for an electronic circuit.

18. The memory of claim 13, wherein the physical structure is an antenna structure.

\* \* \* \* \*